United States Patent
Yun et al.

(10) Patent No.: US 8,964,449 B2
(45) Date of Patent: Feb. 24, 2015

(54) SEMICONDUCTOR MEMORY DEVICE

(75) Inventors: Tae Sik Yun, Seoul (KR); Kang Seol Lee, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 542 days.

(21) Appl. No.: 13/355,781

(22) Filed: Jan. 23, 2012

(65) Prior Publication Data
US 2012/0287699 A1  Nov. 15, 2012

(30) Foreign Application Priority Data
May 11, 2011 (KR) .................. 10-2011-0044209

(51) Int. Cl.
G11C 11/24 (2006.01)
G11C 11/4076 (2006.01)
G11C 11/4091 (2006.01)
G11C 11/4099 (2006.01)

(52) U.S. Cl.
CPC ........ *G11C 11/4076* (2013.01); *G11C 11/4091* (2013.01); *G11C 11/4099* (2013.01)
USPC ......... 365/149; 365/207; 365/203; 365/185.2

(58) Field of Classification Search
USPC ............. 365/149, 185.2, 185.21, 185.23, 365/185.25, 156, 129, 189.07, 203, 207, 365/210.1
See application file for complete search history.

(56) References Cited

U.S. PATENT DOCUMENTS

2007/0139995 A1* 6/2007 Sekiguchi et al. ............ 365/149
2008/0285370 A1* 11/2008 Okuyama .................... 365/222

FOREIGN PATENT DOCUMENTS

KR          100237050 B1    10/1999
KR       1020000051869 A     8/2000

* cited by examiner

*Primary Examiner* — Son Dinh
*Assistant Examiner* — Uyen B Tran

(57) ABSTRACT

A semiconductor memory device selects one of a plurality of memory cells as a dummy memory cell. The dummy memory cell is connected to a bit line that is complementary to a bit line connected to a selected memory cell. This technique advantageously compensates capacitance of the bit line. The semiconductor memory device comprises a selected memory cell connected to a first bit line and a first word line, a dummy memory cell connected to a second bit line complementary to the first bit line and a second word line, and a sense amplifier connected to the first and second bit lines and configured to read data stored in the selected memory cell by simultaneously enablement of the first and second word lines.

8 Claims, 11 Drawing Sheets

SEMICONDUCTOR MEMORY DEVICE

CROSS-REFERENCE TO RELATED APPLICATION

The priority of Korean patent application No. 10-2011-0044209 filed on May 11, 2011 the disclosure of which is hereby incorporated in its entirety by reference, is claimed.

BACKGROUND OF THE INVENTION

Embodiments of the present invention relate generally to a semiconductor memory device, and more particularly to a semiconductor memory device comprising memory cells storing electric charges in a capacitor to write data.

In generally, a semiconductor memory device is a memory device for storing data that can be read when necessary. Semiconductor memory devices may be divided into a Random Access Memory (RAM) and a Read Only Memory (ROM). RAM is a type of volatile memory device the data stored in which is lost when a power supply is stopped.

ROM is a type of nonvolatile memory device the data stored in which is not lost even when no power is supplied.

BRIEF SUMMARY OF THE INVENTION

Embodiments of the present disclosure are directed to providing a semiconductor memory device with reducing read failures. Read failures may occur due to capacitance imbalance of a pair of bit lines in a process that senses electric charges stored in a memory cell to "read" the bit of data stored in the memory cell. Therefore, a semiconductor memory device according to the present disclosure has improved operation reliability.

According to an embodiment of the present disclosure, a semiconductor memory device may comprise a first bit line, a second bit line complementary to the first bit line, a first word line, a second word line, a selected memory cell, a dummy cell, and a sense amplifier. The selected memory cell may be connected to the first bit line and the first word line. The dummy memory cell may be connected to the second bit line and the second word line. The sense amplifier may be connected to the first and second bit lines, and may read data written in the selected memory cell by simultaneously enabling the first and second word lines.

The dummy memory cell may be precharged to a first voltage level in response to a precharge command signal.

The first voltage level may be the same as a voltage level where the first and second bit lines are precharged.

The selected memory cell may include a first capacitor which stores electric charges corresponding to the written data. The dummy memory cell may include a second capacitor which is precharged so as to compensate capacitance of the second bit line.

The semiconductor memory device may further comprise a driving unit driving the first and second word lines based on an address signal.

The driving unit may include a main word line driver and a dummy main word line driver. The main word line driver may generate a main word line driving signal for driving the first word line. The dummy main word line driver may generate a dummy main word line driving signal for driving the second word line.

The dummy main word line driver may provide the main word line driving signal based on the address signal and an active signal.

The semiconductor memory device may further comprise a sub word line driver driving the first and second word lines based on one of the address signal, the main word line driving signal, and the dummy main word line driving signal.

The first and second bit lines may have an open bit line structure.

The sub word line driver may include an inverting transistor unit and a voltage dropping unit. The inverting transistor may supply a complementary sub word line driving signal to the second word line in response to the dummy main word line driving signal. The voltage dropping unit may decrease a voltage level of the second word line to a ground voltage level in response to the sub word line driving signal.

The dummy main word line driving signal may be a signal for enabling a second main word line adjacent to a first main word line driven by the main word line driving signal.

The sub word line driving circuit may include an inverting transistor unit and a voltage dropping unit. The inverting transistor unit may shift the corresponding bit of the sub word line driving signal by 2 bits in response to the dummy main word line driving signal to supply a shift sub word line driving signal to the second word line. The voltage dropping unit may decrease a voltage of the second word line to a ground voltage level in response to a complementary signal of the shift sub word line driving signal.

The sub word line driver may include an inverting transistor unit and a voltage dropping unit. The inverting transistor unit may supply a boosting voltage to the second word line in response to the dummy main word line driving signal. The voltage dropping unit may decrease a voltage of the second word line to a ground voltage level in response to the dummy main word line driving signal.

The first and second bit lines may have a folded bit line structure.

The dummy main word line driving signal may be generated based on the main word line driving signal and the sub word line driving signal.

DESCRIPTION OF EMBODIMENTS

Embodiments of the present invention will be described in detail with reference to the attached drawings.

Figure 1:
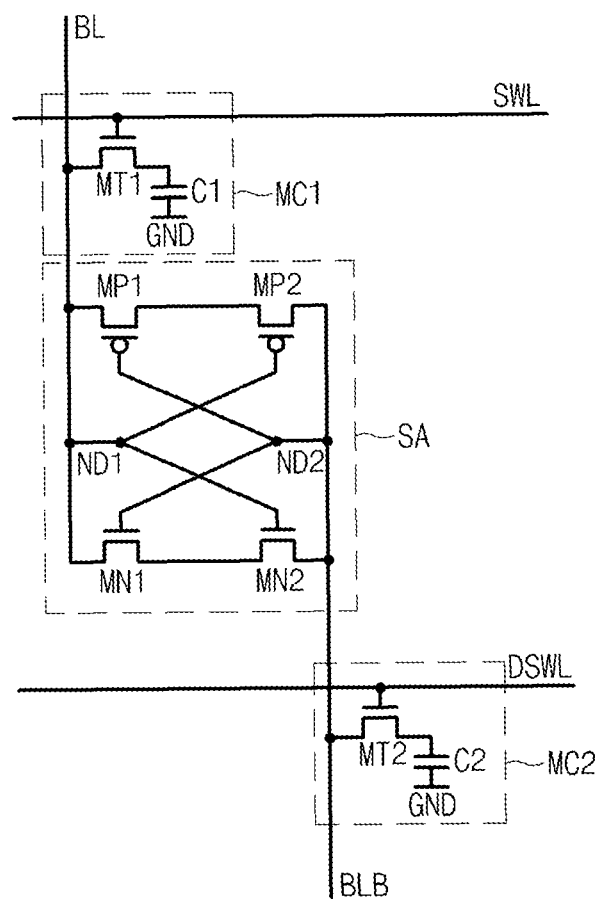
FIG. 1 is a circuit diagram illustrating a memory cell array included in a semiconductor memory device according to an embodiment of the present invention.

FIG. 1 is a circuit diagram illustrating a memory cell array included in a semiconductor memory device according to an embodiment of the present invention.

Referring to FIG. 1, the memory cell array includes a bit line BL, a bit line bar BLB that is complementary to the bit line BL, a sub word line SWL extended in a direction intersecting with the pair of bit lines BL and BLB, a dummy sub word line DSWL. The memory cell also includes a first memory cell MC1 that is connected to the sub word line SWL and the bit line BL. The memory cell further includes a second memory cell MC2 that is connected to the dummy sub word line DSWL and the bit line bar BLB. Additionally, the memory cell includes a sense amplifier SA.

Since the memory cell array of the semiconductor memory device as depicted in FIG. 1 has an open bit line structure, the sense amplifier SA senses a voltage difference between the bit line BL and the bit line bar BLB through a first node ND1 and a second node ND2 to output the voltage difference as an output signal.

In the example shown in FIG. 1, the first memory cell MC1 includes a first memory transistor MT1 and a first capacitor C1, and the second memory cell MC2 includes a second memory transistor MT2 and a second capacitor C2. The first memory cell MC1 performs an operation of charging and/or discharging the first capacitor C1 in response to the first memory transistor MT1 switching on and off. The first memory cell MC1 charges the first capacitor C1 to store data therein, and discharges the first capacitor C1 to erase the data therefrom. When a specific amount of electric charges is charged in the first capacitor C1, the sub word line SWL is enabled to perform a precharge operation to develop an output signal when voltage level at the first and second nodes ND1 and ND2 is set at half of the level of a boosting voltage. During the process of developing the data stored in the first memory cell MC1, capacitances between the bit line BL and the bit line bar BLB may be different, which results in generation of an error of the output signal by the capacitance. Thus, the semiconductor memory device according to an embodiment of the present invention, when reading data stored in a given memory cell, selects a memory cell connected to the same sense amplifier SA as a dummy cell to drive the dummy cell, thereby compensating a capacitance mismatching to each bit line.

The sense amplifier SA includes first and second PMOS transistors MP1 and MP2, and further includes first and second NMOS transistors MN1 and MN2. The first PMOS transistor MP1 includes a gate connected to the second node ND2 and a first terminal connected to the first node ND1. The second PMOS transistor MP2 includes a gate connected to the first node ND1, a first terminal connected to a second terminal of the first PMOS transistor MP1, and a second terminal connected to the second node ND2.

The first NMOS transistor MN1 includes a gate connected to the second node ND2 and a second terminal connected to the first node ND1. The second NMOS transistor MN2 includes a gate connected to the first node ND1, a first terminal connected to the second node ND2, and a second terminal connected to a first terminal of the first NMOS transistor MN1.

However, a voltage difference between the first node ND1 and the second node ND2 may be different from an actual voltage difference of the output signal of the memory cell array due to a difference of the driving ability of the first and second PMOS transistors MP1, MP2 and the first and second NMOS transistors MN1, MN2 or a physical weakness of each node. Therefore, error may occur when amplifying a voltage difference between the bit line BL and the bit line bar BLB.

Referring to FIG. 1, the first memory cell MC1 may be accessed as the selected memory cell to read data stored therein. According to the techniques of the present invention, for capacitance compensation when reading the data stored in the first memory cell MC1, the second memory cell MC2 is selected as a dummy memory cell so that the word line connected to the second memory cell MC2 may be represented as the dummy sub word line DSWL. The vice versa may be achieved in other embodiments. For example, the first memory cell MC1 may be selected as the dummy memory cell when the second memory cell MC2 is the selected memory cell.

In the semiconductor memory device having an open bit line structure, the memory cells included in the bit line BL connected to the sense amplifier SA and the bit line bar BLB that has a complementary relation to the bit line BL may be selected as a dummy memory cell. According to an embodiment of the present invention, when a memory cell connected to the bit line BL connected to the sense amplifier SA is selected, a memory cell connected to the bit line bar BLB may be selected as a dummy memory cell. Likewise, when a memory cell connected to the bit line bar BLB that is connected to the sense amplifier SA is selected, a memory cell connected to the bit line BL may be selected as a dummy memory cell. Since the dummy memory cell is selectively operated from a plurality of memory cells, the dummy memory cell is not necessarily included as an additional configuration and the location of the dummy memory cell may be different depending on a control method.

Figure 2:
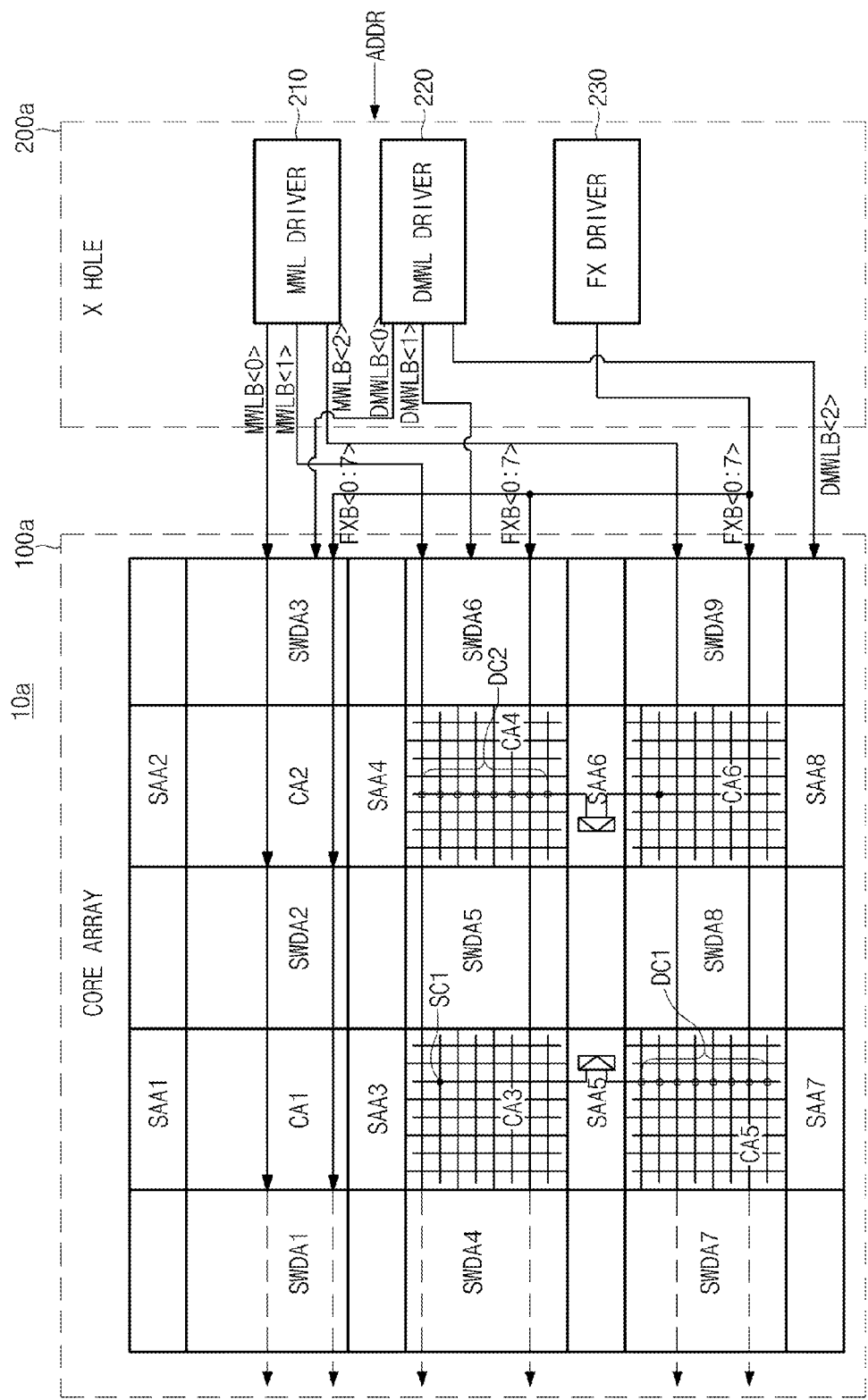
FIG. 2 is a block diagram illustrating a semiconductor memory device according to an embodiment of the present invention.

FIG. 2 is a block diagram illustrating a semiconductor memory device according to an embodiment of the present invention.

Referring to FIG. 2, a semiconductor memory device 10a includes a core array 100a and an X hole 200a.

The core array 100a includes a plurality of cell arrays CA1, CA2, ..., CA6, a plurality of sub word line driver arrays SWDA1, SWDA2, ..., SWDA9, and a plurality of sense amplifier arrays SAA1, SAA2, ..., SAA8.

Each of the cell arrays CA1, CA2, ..., CA6 includes a plurality of memory cells which may be represented as a mat MAT. The structure of each of the cell arrays CA1, CA2, ..., CA6 and each of the sense amplifier arrays SAA1, SAA2, ..., SAA8 of FIG. 2 may be substantially the same as that depicted in FIG. 1.

The sub word line driver arrays SWDA1, SWDA2, ..., SWDA9 are connected to and enable the sub word lines of the cell arrays CA1, CA2, ..., CA6, respectively.

The X hole 200a generates a main word line driving signal MWLB, a dummy main word line driving signal DMWLB, and a sub word line driving signal FXB based on an address signal ADDR.

The main word line driving signal MWLB enables a plurality of main word lines included in the core array 100a. When an accessed main word line of a plurality of main word lines is selected based on the main word line driving signal MWLB, the dummy main word line driving signal DMWLB may be generated to drive, simultaneously with the main word line, a selected dummy main word line. The selected dummy main word line may be a main word line included in the upper or lower cell array adjacent to the cell array CA that includes the main word line connected to the selected memory cell facing one another with a respective sense amplifier array SAA between them.

For example, when a first memory cell SC1 included in the third cell array CA3 is the selected memory cell based on the address signal ADDR, the first memory cell SC1 may be connected to a bit line included in a fifth cell array CA5 through a sense amplifier included in the fifth sense amplifier array SAA5. As a result, one of the dummy memory cells DC1 included in the fifth cell array CA5 may be selected as a dummy memory cell. Accordingly, the dummy main word line driving signal DMWLB may be provided to enable a plurality of memory cells included in the downward adjacent fifth cell array CA5 through the third cell array CA3 and the fifth sense amplifier array SAA5.

When a second main word line driving signal MWLB<1> is enabled, a third dummy main word line driving signal DMWLB<2> may be enabled. However, when the second main word line driving signal MWLB<1> is enabled depending on the connection relation of the sense amplifier SA, a corresponding first dummy main word line driving signal DMWLB<0> may be enabled. The connection relation between the sense amplifier array SAA and the cell array CA may be different depending on an address of each bit line. As a result, a dummy main word line driver 220 included in the X hole 200a may generate the is dummy main word line driving signal DMWLB based on a bit line address and the main word line driving signal MWLB.

In another embodiment of the present invention, when a data bit stored in a second memory cell SC2 included in the sixth cell array CA6 is read, the dummy main word line driving signal DMWLB may be generated to enable one of the second dummy memory cells DC2 included in the upward adjacent fourth cell array CA4 through the sixth sense amplifier array SAA6. When a third main word line driving signal MWLB<2> is enabled, a second dummy main word line driving signal DMWLB<1> may be enabled.

A sub word line driving signal FXB is provided to select one of a plurality of sub word lines connected to the main word line.

According to the present invention, the semiconductor memory device 10a comprising the memory cell array CA with an open bit line structure selects as a dummy main word line such that the upper or lower main word line of the cell array CA including the main word line enabled depends on the connection relation of the sense amplifier SA and the cell array CA.

According to an embodiment of the present invention, the upper or lower one of the main word lines can be selected based on the bit line address. For example, the relation between the dummy main word line and the main word line may be determined depending on whether the bit line is an odd-numbered bit line (e.g., the $1^{st}$, $3^{rd}$, $5^{th}$, etc) or an even-numbered bit line (e.g., the $2^{nd}$, $4^{th}$, $6^{th}$, etc).

Figure 3:
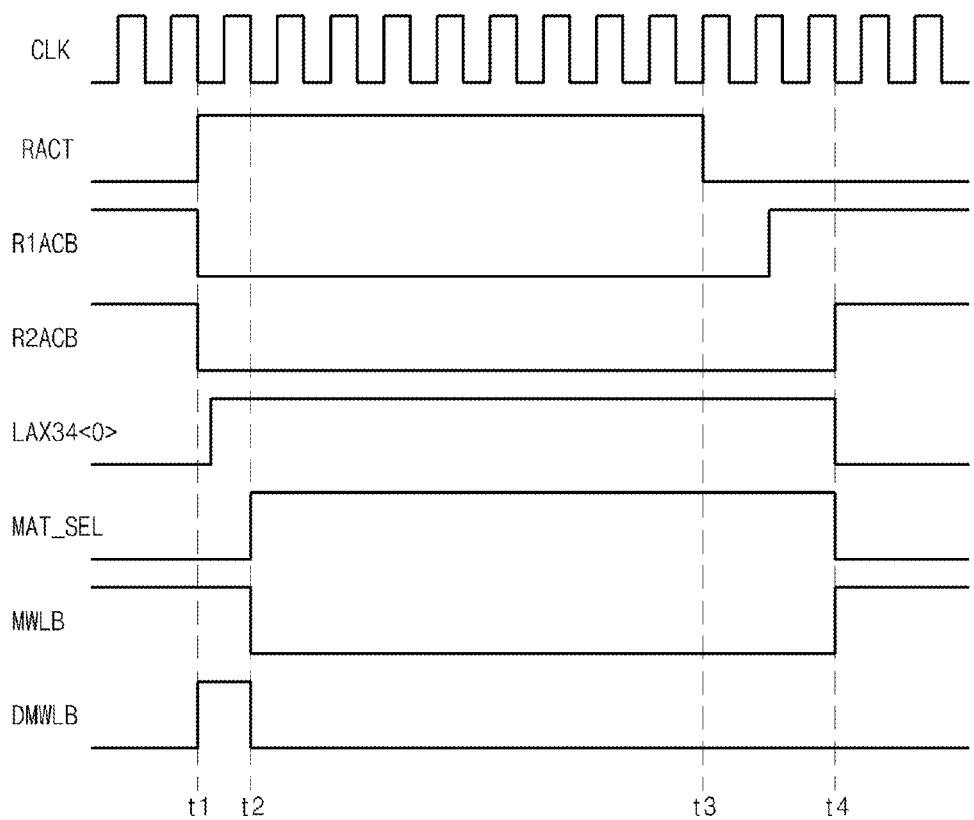
FIG. 3 is a waveform diagram illustrating the operation of the semiconductor memory device according to an embodiment of the present invention.

FIG. 3 is a waveform diagram illustrating the operation of the semiconductor memory device according to an embodiment of the present invention.

Referring to FIG. 3, the semiconductor memory device 10a operates in synchronization with a clock signal CLK.

At time t1, in response to an active signal RACT included in a command signal, a R1ACB signal, a R2ACB signal and a LAX34<0> signal corresponding to address signals are generated. For example, the R1ACB signal is disabled after a pre-decoded address signal is supplied to a main word line driver 210 and a sub word line driver 230, and the R2ACB signal disables the main word line driving signal MWLB and the sub word line driving signal FXB.

The dummy main word line driving signal DMWLB is disabled in response to the active signal RACT. In FIG. 3, the main word line driving signal MWLB and the dummy main word line driving signal DMWLB may be low-enable signals. That is, the dummy main word line may be precharged before the main word line is enabled and disabled in response to the active signal RACT.

At time t2, a mat selecting signal MAT_SEL is enabled based on the address signals to select a mat MAT that includes predetermined memory cells of the semiconductor memory device. As a result of selecting a specific mat, the main word line driving signal MWLB is low-enabled to enable to the selected memory cell. In the process of reading data stored in the selected memory cell, the dummy main word line driving signal DMWLB is low-enabled to compensate capacitance of a pair of the bit lines connected to the sense amplifier SA.

Thus, the semiconductor memory device according to an embodiment of the present invention can read accurately the data stored in the selected memory cell with the compensated capacitance of the dummy memory cell.

At time t3, the read operation is completed to disable the active signal RACT. As a result, the R1ACB signal, the R2ACB signal and the LAX34<0> included in the address signals are disabled, and the mat selecting signal MAT_SEL and the main word line driving signal MWLB are disabled.

According to an embodiment of the present invention, the dummy main word line driving signal DMWLB is enabled even at time t4 to maintain the capacitance in the dummy memory cell at a precharge level, thereby preventing error in data read that may be caused by a difference between the amount of electric charges stored in a capacitor in the dummy memory cell and the amount of electric charges stored in a capacitor in the selected memory cell.

Figure 4:
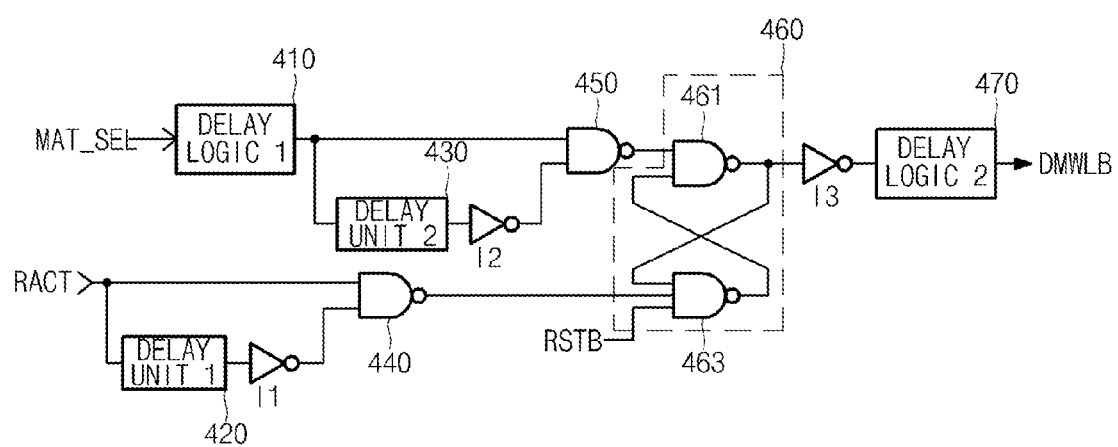
FIG. 4 is a diagram illustrating an of a dummy main word line driver of FIG. 2.

FIG. 4 is a diagram illustrating an example of the dummy main word line driver 220 of FIG. 2.

Referring to FIG. 4, the dummy main word line driver 220 includes a plurality of delay logics 410 and 470.

The first delay logic 410 delays the mat selecting signal MAT_SEL to supply the delayed signal to a second delay unit 430 and a first logic operator 450.

The first logic operator 450 performs an AND operation on (1) the mat selecting signal MAT_SEL that is delayed by the first delay logic 410 and (2) a signal that is delayed by a predetermined time by the second delay unit 430 and further inverted by a second inverter I2. The first logic operator 450 supplies a result signal of the AND operation to a latch circuit 460.

A second logic operator 440 performs an AND operation on (1) the active signal RACT and (2) a signal that is delayed by a predetermined time by a first delay unit 420 and further inverted by a first inverter I1. The second logic operator 440 supplies a result signal of the AND operation to a latch circuit 460.

The latch circuit 460 includes third and fourth logic operators 461 and 463, and supplies an output signal to a third inverter I3. The output signal is enabled in response to an output signal of the first logic operator 450. The output signal is disabled in response to an output signal of the second logic operator 440.

The third and fourth logic operators 461 and 463 are cross-connected to form a general R-S latch structure. The fourth logic operator 463 receives a reset signal RSTB.

The second delay logic 470 delays an output signal of the third inverter I3 by a predetermined time to provide the dummy main word line driving signal DMWLB.

Thus, the dummy main word line driver 220 according to an embodiment of the present invention generates the dummy main word line driving signal DMWLB based on the mat selecting signal MAT_SEL and the active signal RACT.

The operation waveform characteristic of the dummy main word line driving signal DMWLB generated from the dummy main word line driver 220 is depicted in FIG. 3.

Figure 5:
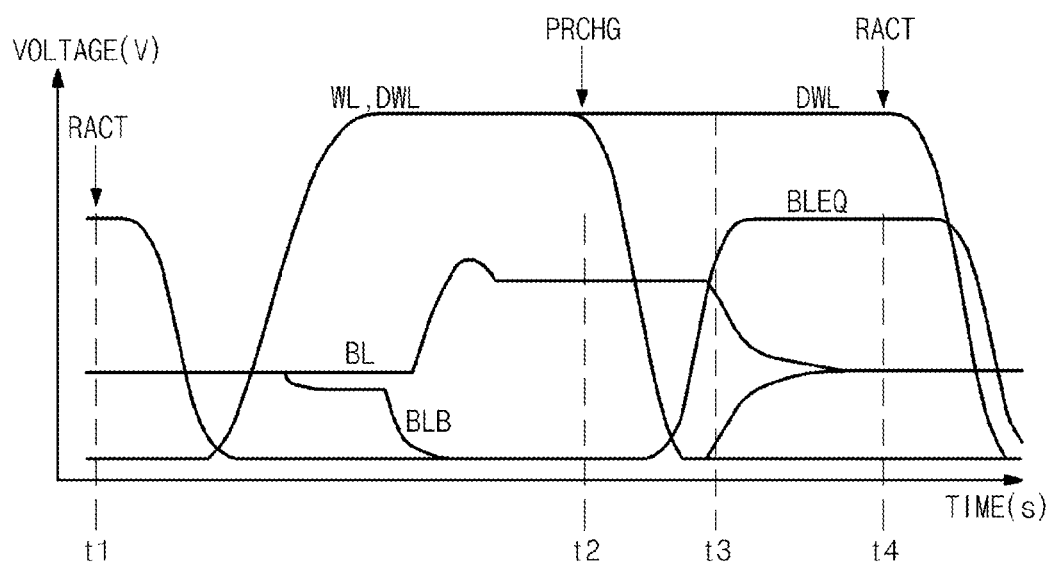
FIG. 5 is a diagram illustrating the operation of the semiconductor memory device according to an embodiment of the present invention.

FIG. 5 is a diagram illustrating the operation of the semiconductor memory device according to an embodiment of the present invention.

Referring to FIG. 5, at time t1, a bit line equalize signal BLEQ for performing a precharge operation is disabled in response to the active signal RACT. The bit line BL and the bit line bar BLB, which are precharged to the same voltage level in response to the bit line equalize signal BLEQ, develop a voltage differential therebetween depending on the data stored in the selected memory cell by the enabling of a word line WL and a dummy word line DWL in response to the active signal RACT. The word line WL of FIG. 5 includes a main word line MWL and a sub word line SWL. The dummy word line DWL of FIG. 5 includes a dummy main word line DMWL and a dummy sub word line DSWL.

In of the example shown in FIG. 5, the voltage level of the bit line BL changes to a voltage level 'high' and the voltage level of the bit line bar BLB changes to a voltage level 'low'. After the voltage levels of a pair of the bit lines are sensed to read the data written in the selected memory cell, the word line WL is disabled in response to a precharge signal PRCHG. However, the dummy word line DLW maintains an enabled status as shown in FIG. 3.

At time t3, when the bit line equalize signal BLEQ is enabled while the dummy word line DWL is enabled, the bit lines BL and BLB are precharged. A capacitor included in the dummy memory cell connected to the dummy word line DWL stores electric charges corresponding to substantially the same voltage as a precharge level of the paired bit lines BL and BLB. After the precharge operation is completed, the active signal RACT is re-enabled at time t4 so that the semiconductor memory device may perform a read operation.

Figure 6:
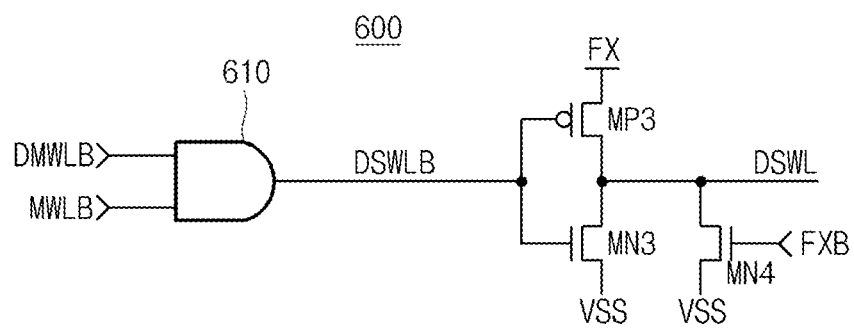
FIG. 6 is a circuit diagram illustrating a dummy sub word line driver of the semiconductor memory device according to an embodiment of the present invention.

FIG. 6 is a circuit diagram illustrating a dummy sub word line driver of the semiconductor memory device according to an embodiment of the present invention.

Referring to FIG. 6, a dummy sub word line driver 600 may be included in one or more of the sub word line driver arrays SWDA shown in FIG. 2. The dummy sub word line driver 600 includes a fifth logic operator 610, a third PMOS transistor MP3, a third NMOS transistor MN3 and a fourth NMOS transistor MN4.

The fifth logic operator 610 performs an AND operation, on (1) the dummy main word line driving signal DMWLB and (2) the main word line driving signal MWLB, to provide a dummy sub word line driving signal DSWLB. That is, the dummy sub word line driving signal DSWLB may be low-enabled when one of the dummy main word line driving signal DMWLB and the main word line driving signal MWBL is low-enabled.

The third PMOS transistor MP3 includes a first terminal for receiving a complementary sub word line driving signal FX, a gate for receiving the dummy sub word line driving signal DSWLB and a second terminal connected to the dummy sub word line DSWL. The third NMOS transistor MN includes a first terminal connected to a ground voltage VSS, a gate for receiving the dummy sub word line driving signal DSWLB and a second terminal connected to the dummy sub word line DSWL. The third PMOS transistor MP3 and the third NMOS transistor MN3 pull the voltage level of the dummy sub word line DSWL up towards the complementary sub word line driving signal FX to when the dummy sub word line driving signal DSWLB is low-enabled. Conversely, the third PMOS transistor MP3 and the third NMOS transistor MN3 drops the voltage level of the dummy sub word line DSWL down towards a ground voltage VSS level when the dummy sub word line driving signal DSWLB is high-disabled.

The fourth NMOS transistor MN4 includes a first terminal connected to the ground voltage VSS, a gate for receiving a sub word line driving signal FXB and a second terminal connected to the dummy sub word line DSWL. When the sub word line driving signal FXB is high-enabled, the fourth NMOS transistor MN4 drops the voltage level of the dummy sub word line DSWL down towards the ground voltage VSS.

As a result, the dummy sub word line DSWL may be enabled when the dummy sub word line driving signal DSWLB is enabled. Consequently, a specific sub word line is selected by the sub word line driving signal FXB.

In an embodiment of the semiconductor memory device that includes the memory cell array with an open bit line structure according to the present invention, the semiconductor memory device may comprise the dummy sub word line driver 600 which has substantially the same structure as that shown in FIG. 6. That is, based on the address signal generated by the semiconductor memory device, a plurality of sub word lines included in the memory cell array may be selected as the dummy sub word line so that each of the selected sub word lines may be driven by the dummy sub word line driver 600 as shown in FIG. 6.

In an embodiment, at least one sub word line driver array SWDA included in the core array 100a of FIG. 2 may include at least one dummy sub word line driver 600.

Figure 7:
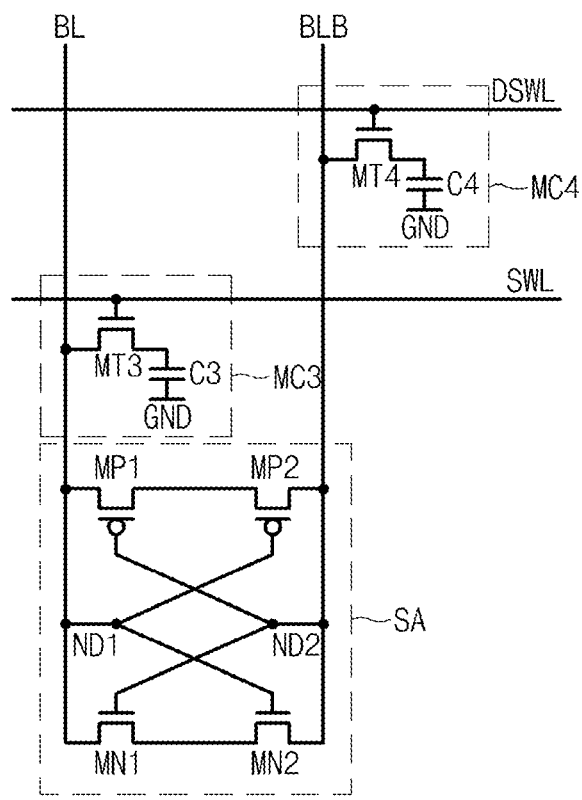
FIG. 7 is a circuit diagram illustrating a semiconductor memory device according to an embodiment of the present invention.

FIG. 7 is a circuit diagram illustrating a semiconductor memory device according to an embodiment of the present invention.

In comparison with the semiconductor memory device of FIG. 1, FIG. 7 shows when the semiconductor memory device has a folded bit line structure where the bit line BL and the bit line bar BLB are connected to each other through the sense amplifier SA. As a result, the dummy sub word line DSWL and the sub word line SWL may be included in the same mat and share the main word line MWL.

A third memory cell MC3 connected to the bit line BL and the sub word line SWL includes a third memory transistor MT3 and a third capacitor C3. The third memory cell MC3 stores a voltage supplied through the bit line BL in the third capacitor C3 when the sub word line SWL is enabled. The third memory cell MC3 supplies the electric charges, is representative of one bit of data, stored in the third capacitor C3 to the bit line BL when the sub word line SWL is enabled.

In an embodiment in which the third memory cell MC3 is the selected memory cell, a fourth memory cell MC4 as a dummy memory cell connected to the dummy sub word line DSWL and the bit line bar BLB stores electric charges corresponding to ½ of a boosting voltage VPP in a fourth capacitor C4. When the fourth memory cell MC4 reads data of the third memory cell MC3, the sub word line SWL and the dummy sub word line DSWL can be simultaneously enabled.

Since the fourth memory cell MC4 is simultaneously enabled, no memory cells connected to the bit line bar BLB are enabled, thereby minimizing errors which may be caused when a data bit stored in the third memory cell MC3 and sensed in the sense amplifier SA is read by parasitic capacitance between the memory cells connected to the bit lines.

The reference numbers of each element in FIG. 7 are substantially the same as those in FIG. 1 and thus, detailed explanation of each element of FIG. 7 will not be provided in the interest of brevity.

Figure 8:
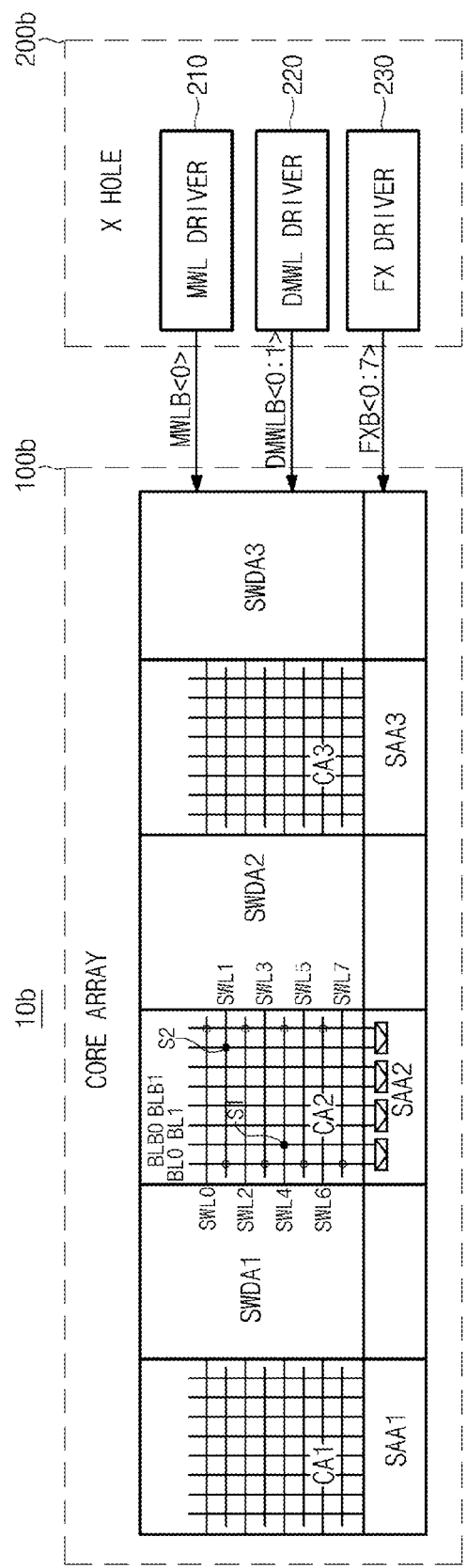
FIG. 8 is a diagram illustrating a semiconductor memory device according to an embodiment of the present invention.

FIG. 8 is a diagram illustrating a semiconductor memory device according to an embodiment of the present invention. Referring to FIG. 8, a semiconductor memory device 10b comprises a core array 100b and an X hole 200b. In comparison with FIG. 2, the core array 100b of FIG. 8 includes the first sense amplifier array SAA1 connected to memory cells included in the first cell array CA1, the second sense amplifier array SAA2 connected to memory cells included in the second cell array CA2, and the third sense amplifier array sAA3 connected to memory cells included in the third cell array CA3.

Based on the sub word line driving signal FXB, the first sub word line driver array SWDA1 drives first, third, fifth and seventh sub word lines SWL0, SWL2, SWL4 and SWL6, and the second sub word line driver array SWDA2 drives second, fourth, sixth and eighth sub word lines SWL1, SWL3, SWL5 and SWL7. As a result, the dummy main word line driver 220 generates the dummy main word line driving signal DMWLB in response to the sub word line driving signal FXB. The dummy main word line driving signal DMWLB provided to one main word line may be allotted to have a digital signal of two bits. Each dummy main word line driving signal DMWLB drives the odd-numbered sub word lines and the even-numbered sub word lines. However, as this is merely an embodiment, the method of driving the sub word lines in response to the dummy main word line driving signal DMWLB is not limited herein.

For example, when a data bit stored in a first selected memory cell S1 connected to the fifth sub word line SWL4 and a first bit line bar BLB0 is accessed, a sense amplifier included in the second sense amplifier array SAA2 selects one memory cell as a dummy memory cell from a plurality of memory cells connected to the first selected memory cell S1 and a first bit line BL0. In order to enable the first selected memory cell S1, a sub word line driver included in the first sub word line driver array SWDA1 is enabled based on the main word line driving signal MWBL and the sub word line driving signal FXB. At least one of sub word line drivers included in the second sub word line driver array SWDA2 may be enabled based on the dummy main word line driving signal DMWLB or the sub word line driving signal FXB.

Figure 9A:
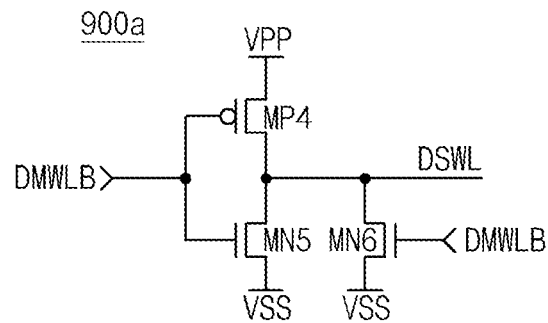
FIG. 9A is a circuit diagram an example of the dummy sub word line driver when the semiconductor memory device according to an embodiment of the present invention includes a memory cell array having a folded bit line structure.

FIG. 9a is a circuit diagram of an example of the dummy sub word line driver when the semiconductor memory device according to an embodiment of the present invention includes a memory cell array having a folded bit line structure.

Referring to FIG. 9a, a dummy sub word line driver 900a includes a fourth PMOS transistor MP4, a fifth NMOS transistor MN5, and a sixth NMOS transistor MN6.

The fourth PMOS transistor MP4 and the fifth NMOS transistor MN5 are connected in series between the boosting voltage VPP and the ground voltage VSS to each receive the dummy main word line driving signal DMWLB through a respective gate. The fourth PMOS transistor MP4 and the fifth NMOS transistor MN5 supply the boosting voltage VPP to the dummy sub word line DSWL when the dummy main word line driving signal DMWLB is low-enabled corresponding to a logic status 'low'. The fourth PMOS transistor MP4 and the fifth NMOS transistor MN5 supply the ground voltage VSS to the dummy sub word line DSWL when the dummy main word line driving signal DMWLB is high-disabled corresponding to a logic status 'high'.

The sixth NMOS transistor MN6 is connected between the dummy sub word line DSWL and the ground voltage VSS. The sixth NMOS transistor drops a voltage level of the dummy sub word line DSWL down towards the ground voltage VSS level in response to the dummy main word line driving signal DMWLB being high-disabled.

Thus, the dummy sub word line driver 900a enables the dummy sub word line DSWL when the dummy main word line driving signal DMWLB is low-enabled corresponding to the logic status 'low' and disables the dummy sub word line DSWL when the dummy main word line driving signal DMWLB is high-disabled corresponding to the logic status 'high'.

Figure 9B:
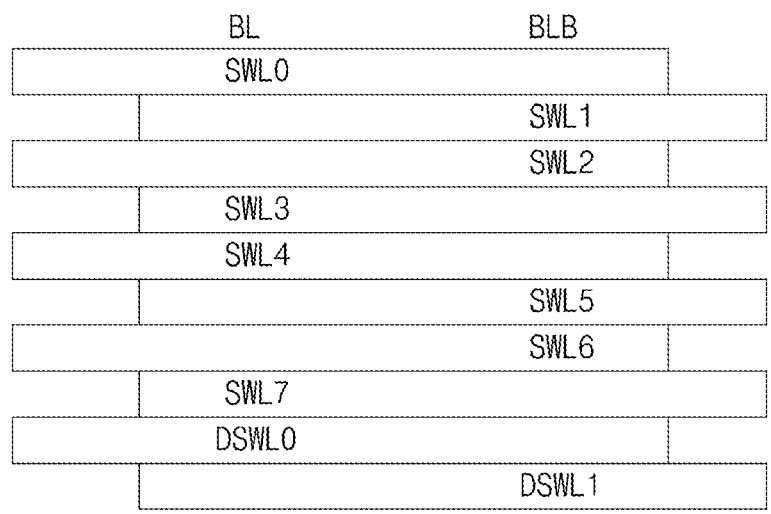
FIG. 9B is a diagram illustrating the way each sub word line is driven as a dummy sub word line when the semiconductor memory device includes the sub word line driver of FIG. 9A.

FIG. 9b is a diagram illustrating the way each sub word line is driven as a dummy sub word line when the semiconductor memory device includes the sub word line driver of FIG. 9a.

Referring to FIG. 9b, in a pair of bit lines, a memory cell is connected between first (SWL0), fourth (SWL3), fifth (SWL4) and eighth (SWL7) sub word lines and bit lines, and a memory cell is connected between second (SWL1), third (SWL2), sixth (SWL5) and seventh (SWL6) sub word lines and bit lines.

However, the connection relation between each sub word line and the paired bit lines may be different depending on an arrangement method of the memory cells. For example, of the sub word lines, the odd-numbered sub word lines are driven by the sub word line driver disposed on the left side of the cell array, and the even-numbered sub word lines are driven by the sub word line driver disposed on the right side of the cell array.

According to an embodiment of the present invention, in case that a memory cell connected to the bit line BL is a selected memory cell, the memory cell connected to the bit line bar BLB may be a dummy memory cell. For example, corresponding to the selected memory cell connected to the fourth sub word line SWL3, the second, third, sixth and seventh sub word lines SWL1, SWL2, SWL5 and SWL6 connected to the bit line bar BLB may be dummy memory cells. As such, a second dummy sub word line DSWL1 should be enabled.

Although the dummy sub word lines DSWL0 and DSWL1 are shown being apart from the sub word lines SWL0~SWL7 in FIG. 9b, it represents that the dummy sub word lines are not disposed in the memory cell array apart from the sub word lines. Rather, the dummy sub word lines are selected from a plurality of the sub word lines.

The first dummy sub word line DSWL0 may be driven by the sub word line driver array disposed on the left side of the cell array CA, and the second dummy sub word line DSWL1 may be driven by the sub word line driver array disposed on the right side of the cell array CA.

On the other hand, in case that a memory cell connected to the bit line bar BLB is a selected memory cell, the memory cell connected to the bit line BL may be a dummy memory cell. Accordingly, the first dummy sub word line DSWL0 should be enabled. The enablement of the first and second sub word lines DSWL0 and DSWL1 is determined based on the dummy main word line driving signal DMWLB.

That is, in case of the memory cell array having a folded bit line structure, it is possible to control the enablement status of two bits of the is dummy main word line driving signal DMWLB depending on whether the selected memory cell is connected to one of the paired bit lines.

In case of FIGS. 9a and 9b, at least one of the dummy sub word line drivers may be included in the single sub word line driver array.

Figure 10A:
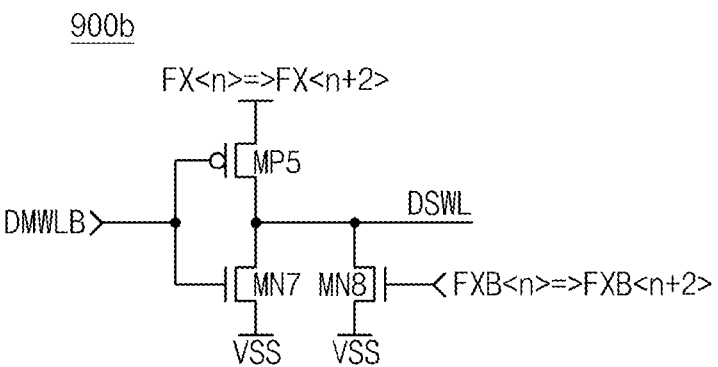
FIG. 10A a circuit diagram an example of the dummy sub word line driver when the semiconductor memory device according to an embodiment of the present invention includes a memory cell array having a folded bit line structure.

FIG. 10a is a circuit diagram illustrating an example of the dummy sub word line driver when the semiconductor memory device according to an embodiment of the present invention includes a memory cell array having a folded bit line structure.

Referring to FIG. 10a, a dummy sub word line driver 900b includes a fifth PMOS transistor MP5, a seventh NMOS transistor MN7, and an eighth NMOS transistor MN8.

The fifth PMOS transistor MP5 includes a gate for receiving the dummy main word line driving signal DMWLB, a first terminal connected to the dummy sub word line DSWL, and a second terminal for receiving a signal increased by two bits from a complementary sub word line driving signal FX<n>, or more specifically, a complementary sub word line driving signal FX<n+2> corresponding to the sub word line disposed by two after the corresponding sub word line. For example, when the dummy sub word line driver 900b is connected to the third sub word line SWL2, a fifth sub word line driving signal FX<4> can be supplied to the second terminal of the fifth PMOS transistor MP5.

The seventh NMOS transistor MN7 includes a gate for receiving the dummy main word line driving signal DMWLB, a first terminal connected to the dummy sub word line DSWL, and a second terminal connected to the ground voltage VSS.

The eighth NMOS transistor MN8, in a similar way as the second terminal of the fifth PMOS transistor MP5, may drop a voltage level of the dummy sub word line DSWL down towards the ground voltage VSS level in response to the sub word line driving signal FX<n> being increased by two bits from a corresponding sub word line driving signal FXB<n>.

The dummy sub word line driver 900b may enable the sub word line driver array disposed on the left or right side of the memory cell array, based on the dummy main word line driving signal DMWLB, to determine whether the dummy memory cell is connected to the bit line BL or the bit line bar BLB, and to determine the enablement of the sub word line driver array interposed by two bits from the sub word line SWL connected to the selected memory cell.

For example, as to the selected memory cell connected to the third sub word line SWL2 and the bit line bar BLB, since the dummy memory cell is supposed to be connected to the bit line BL, the first dummy main word line driving signal DMWLB<0> is enabled and the fifth sub word line SWL6 is selected as a dummy sub word line. That is, the dummy sub word line DSWL may be determined based on the dummy main word line driving signals DMWLB<0>, DMWLB<1> and the sub word line driving signal FXB.

Figure 10B:
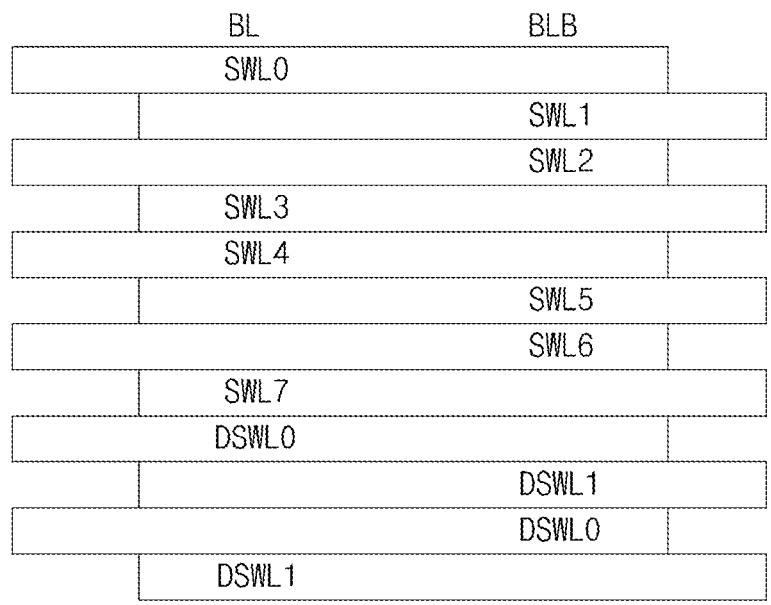
FIG. 10B is a diagram illustrating the way each sub word line is driven as a dummy sub word line when the semiconductor memory device includes the sub word line driver of FIG. 10A.

FIG. 10b is a diagram illustrating the way each sub word line is driven as a dummy sub word line when the semiconductor memory device includes the sub word line driver of FIG. 10a.

Referring to FIG. 10b, the arrangement of the memory cells as to a plurality of the sub word lines. The paired bit lines are substantially the same as that of FIGS. 9a and 9b.

However, FIG. 10b shows that the bit line BL and the bit line bar BLB can be driven for one bit of the dummy main word line driving signal DMWLB because the dummy sub word line driver 900b of FIG. 9b is driven based on the dummy main word line driving signal DMWLB and the sub word line driving signal FXB.

In case that the semiconductor memory device according to an embodiment of the present invention comprises the dummy sub word line driver 900b as shown in FIGS. 10a and 10b, the sub word line driver and the dummy sub word line driver are separately connected to the plurality of sub word lines that are connected to the main word line MWL so that it is possible to control the driving of the sub word line SWL.

Figure 11:
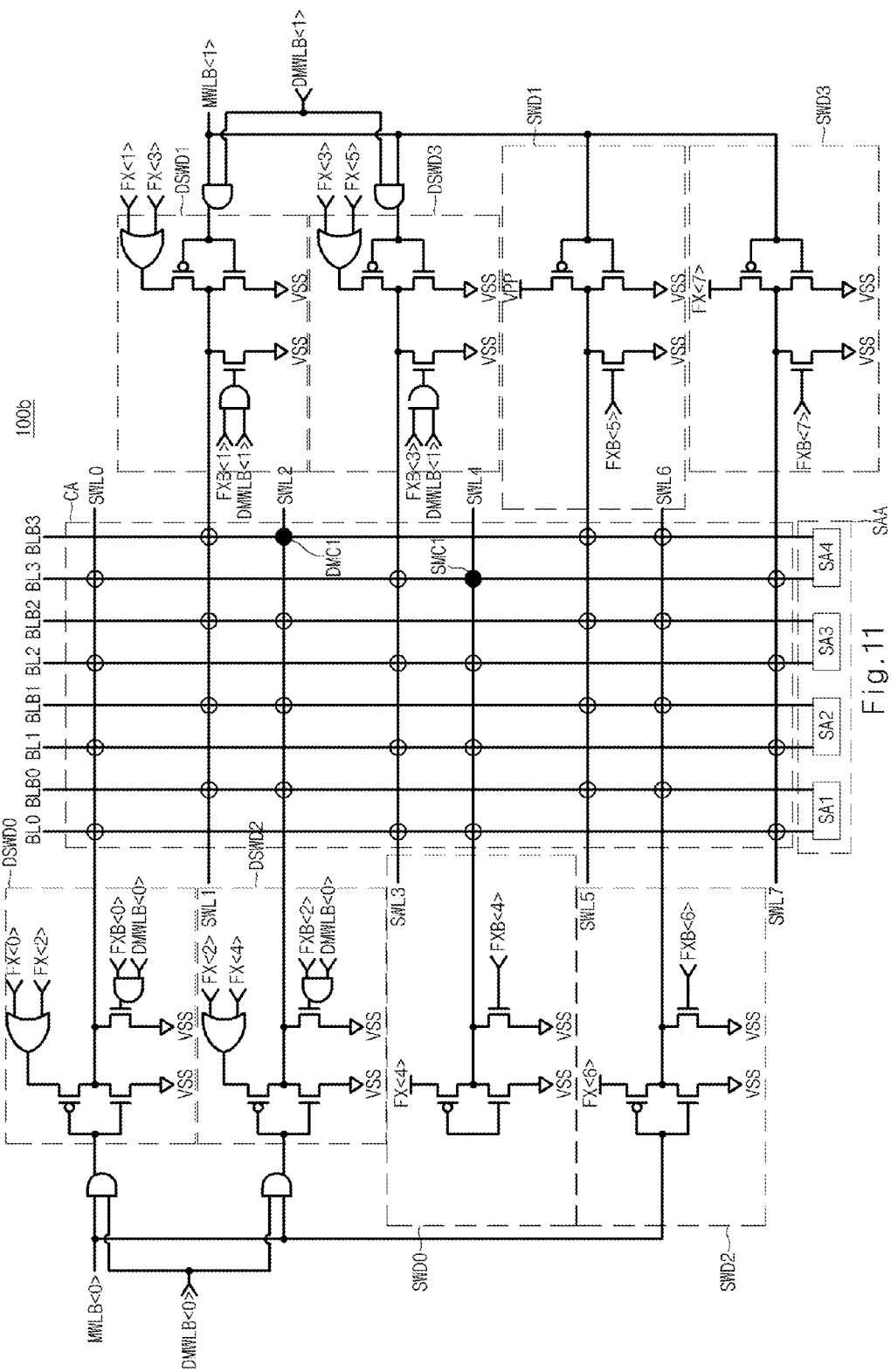
FIG. 11 is a circuit diagram illustrating an example of a core array including the dummy sub word line driver of FIGS. 10A and 10B.

FIG. 11 is a circuit diagram illustrating an example of the core array including the dummy sub word line driver of FIGS. 10a and 10b.

Referring to FIG. 11, the core array 100b includes a cell array CA, a sense amplifier array SAA, a sub word line driver SWD, and a dummy sub word line driver DSWD. The cell array CA includes memory cells connected between a plurality of bit lines BL0, BLB0, BL1, BLB1, BL2, BLB2, BL3, BLB3 and a plurality of sub word lines SWL0~SWL7. The sense amplifier array SAA includes sense amplifiers each of which connected to the paired bit lines of the cell array CA. The sub word line driver SWD is connected to the sub word lines SWL.

A plurality of sub word line drivers SWD0, SWD1, SWD2 and SWD3 pull a voltage level of the sub word lines SWL up towards the complementary sub word line driving signal FX in response to the main word line driving signal MWLB, and drops the voltage level of the sub word line SWL down towards the ground voltage VSS level in response to the sub word line driving signal FXB.

Each of the sub word line drivers DSWD0, DSWD1, dSWD2 and DSWD3 further includes an AND gate because a signal received through each input terminal is the same as that of a general sub word line driver, but it should be operated selectively as a dummy sub word line driver.

For example, the first dummy sub word line driver DSWD0 supplies a signal obtained by performing an AND operation on first and third complementary sub word line driving signals FX<0> and FX<2>, and providing the result to the first sub word line SWL0 in response to a signal obtained by performing an AND operation on a first main word line driving signal MWLB0 and the first dummy main word driving signal DMWLB<0>. Also, the first dummy sub word line driver DSWD0 drops a voltage level on the first sub word line SWL1 down towards the ground voltage VSS in response to a signal obtained by performing an AND operation on the first sub word line driving signal FXB<0> and the third dummy main word line driving signal DMWLB<0>.

As a result, the dummy sub word line drivers DSWD0, DSWD1, DSWD2 and DSWD3 may perform a different operation depending on enablement of the main word line driving signal or the dummy main word line driving signal.

For example, when a first selected memory cell SMC1 is driven, a second main word line driving signal MWLB<0> is low-enabled to a logic status 'low', the fifth complementary sub word line driving signal FX<4> is high-enabled to a logic status 'high', and a fifth sub word line driving signal FXB<4> is low-enabled to a logic status 'low' to enable the fifth sub word line SWL4. As a result, the first selected memory cell SMC1 is driven by the first sub word line driver SWD0.

The third dummy sub word line driver SWD2 supplies to the third sub word line SWL2 a signal obtained by performing an OR operation on the third and fifth sub word line driving signals FX<2> and FX<4> in response to the first dummy main word line driving signal DMWLB<0> and the first main word line driving signal MWLB<0>. As a result, when the third bit line pair connected to a fourth sense amplifier SA4 is enabled, a first dummy memory cell DMC1 is enabled simultaneously with the first selected memory cell SMC1, thereby compensating imbalance bit line capacitance.

Thus, the semiconductor memory device comprising current drivers according to embodiments of the present invention selects a dummy memory cell and drives it simultaneously while reading data stored in a selected memory cell so as to compensate capacitance imbalance of bit lines, thereby improving the reliability of data read. The dummy memory cell is not required separately but the configuration allows a memory cell included in a memory cell array to be selectively driven as the dummy memory cell, thereby simplifying the structure of the semiconductor memory device.

As described above, the semiconductor memory device according to an embodiment of the present invention may compensate a capacitance value with a dummy cell adjacent to a memory cell, thereby improving the accuracy of the sense operation.

The above embodiments of the present invention are illustrative and not to limit the scope of the present invention. Various alternatives and equivalents are possible. The present invention is not limited by the type of deposition, etching polishing, and patterning steps describe herein. Nor is the present invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor memory device, comprising:
a first bit line and a second bit line complementary to the first bit line;
a first word line and a second word line;
a selected memory cell coupled to the first bit line and the first word line;
a dummy memory cell coupled to the second bit line and the second word line;
a sense amplifier coupled to the first and second bit lines and configured to read data stored in the selected memory cell by enabling the first and second word lines;
a main word line driver configured to generate a main word line driving signal to drive the first word line;
a dummy main word line driver configured to generate a dummy main word line driving signal to drive the second word line; and
a sub-word line driver configured to drive the first and second word lines based on one of an address signal, the main word line driving signal, and the dummy main word line driving signal,
wherein the sub-word line driver includes:
an inverting transistor unit configured to shift a corresponding bit of a sub-word line driving signal by 2 bits in response to the dummy main word line driving signal to supply a shift sub-word line driving signal to the second word line.

2. The semiconductor memory device according to claim 1, wherein the dummy memory cell is precharged to a first voltage level in response to a precharge command signal,
wherein the sense amplifier is configured to read data stored in the selected memory cell by simultaneously enabling the first and second word lines.

3. The semiconductor memory device according to claim 2, wherein the first voltage level is substantially the same as a voltage level where the first and second bit lines are precharged.

4. The semiconductor memory device according to claim 1, wherein the selected memory cell includes a first capacitor configured to store electric charges corresponding to the stored data, and
wherein the dummy memory cell includes a second capacitor which is precharged to compensate a capacitance of the second bit line.

5. The semiconductor memory device according to claim 1, wherein the dummy main word line driver provides the dummy main word line driving signal based on the address signal and an active signal.

6. The semiconductor memory device according to claim 1, wherein the sub-word line driver further includes:
a voltage dropping unit configured to drop a voltage of the second word line to a ground voltage level in response to a complementary signal of the shift sub-word line driving signal.

7. The semiconductor memory device according to claim 1, wherein the first and second bit lines have a folded bit line structure.

8. The semiconductor memory device according to claim 1, wherein the dummy main word line driving signal is generated based on the main word line driving signal and the sub-word line driving signal.

* * * * *